US009922830B2

(12) United States Patent
Chang et al.

(10) Patent No.: US 9,922,830 B2
(45) Date of Patent: Mar. 20, 2018

(54) HYBRID III-V TECHNOLOGY TO SUPPORT MULTIPLE SUPPLY VOLTAGES AND OFF STATE CURRENTS ON SAME CHIP

(71) Applicant: International Business Machines Corporation, Armonk, NY (US)

(72) Inventors: Josephine B. Chang, Mahopac, NY (US); Isaac Lauer, Yorktown Heights, NY (US); Amlan Majumdar, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/246,426

(22) Filed: Apr. 7, 2014

(65) Prior Publication Data

US 2015/0287600 A1    Oct. 8, 2015

(51) Int. Cl.
*H01L 29/778* (2006.01)
*H01L 27/092* (2006.01)
(Continued)

(52) U.S. Cl.
CPC .... *H01L 21/2654* (2013.01); *H01L 21/76283* (2013.01); *H01L 21/84* (2013.01); *H01L 27/1203* (2013.01); *H01L 29/78681* (2013.01)

(58) Field of Classification Search
CPC ........... H01L 21/2654; H01L 21/02455; H01L 21/02538; H01L 21/76283; H01L 27/1203
See application file for complete search history.

(56) References Cited

U.S. PATENT DOCUMENTS 6,214,653 B1    4/2001   Chen et al.
6,825,534 B2   11/2004   Chen et al.
(Continued)

FOREIGN PATENT DOCUMENTS

JP        2004153287 A    5/2004
WO    WO2012003611 A    1/2012

OTHER PUBLICATIONS del Alamo et al., "The Prospects for 10 nm III-V CMOS," VLSI Technology Systems and Applications (VLSI-TSA), 2010 International Symposium, pp. 166-167 (Apr. 2010).
(Continued)

*Primary Examiner* — Marcos D Pizarro
*Assistant Examiner* — Nelson Garces
(74) *Attorney, Agent, or Firm* — Louis J. Percello; Michael J. Chang, LLC

(57) ABSTRACT

Techniques for forming dual III-V semiconductor channel materials to enable fabrication of different device types on the same chip/wafer are provided. In one aspect, a method of forming dual III-V semiconductor channel materials on a wafer includes the steps of: providing a wafer having a first III-V semiconductor layer on an oxide; forming a second III-V semiconductor layer on top of the first III-V semiconductor layer, wherein the second III-V semiconductor layer comprises a different material with an electron affinity that is less than an electron affinity of the first III-V semiconductor layer; converting the first III-V semiconductor layer in at least one second active area to an insulator using ion implantation; and removing the second III-V semiconductor layer from at least one first active area selective to the first III-V semiconductor layer.

8 Claims, 4 Drawing Sheets

(51) Int. Cl.
- *H01L 21/8238* (2006.01)
- *H01L 21/265* (2006.01)
- *H01L 21/762* (2006.01)
- *H01L 27/12* (2006.01)
- *H01L 21/84* (2006.01)
- *H01L 29/786* (2006.01)

(56) References Cited

U.S. PATENT DOCUMENTS

| | | | |
|---|---|---|---|
| 6,867,439 B2* | 3/2005 | Imanishi | H01L 27/0605 257/194 |
| 2001/0016383 A1 | 8/2001 | Chen et al. | |
| 2014/0361335 A1* | 12/2014 | Flachowsky | H01L 27/092 257/190 |

OTHER PUBLICATIONS

I. Vurgaftman et al., "Band parameters for III-V compound semiconductors and their alloys", Journal of Applied Physics, vol. 89, No. 11, pp. 5815-5875, (Jun. 2001).

Yokoyama et al., "Sub-10-nm Extremely Thin Body InGaAs-on-Insulator MOSFETs on Si Wafers With Ultrathin Al2O3 Buried Oxide Layers," IEEE Electron Device Letters, vol. 32, issue 9 (Sep. 2011).

Cooke, "First InGaAs n-MOSFETs on germanium-on-insulator," Semiconductor Today, Compounds & Advanced Silicon, vol. 7, issue 10 (Dec. 2012/Jan. 2013).

J.W. Mathews and A.E. Blakeslee, "Defects in Epitaxial Multilayers, I. Misfit Dislocations" Journal of Crystal Growth 27 (Dec. 1974) pp. 118-125.

Majumdar et al., "Gate Length and Performance Scaling of Undoped-Body Extremely Thin SOI MOSFETs," IEEE Electron Device Letters, vol. 30, No. 4 (Apr. 2009).

Weyher, "Defect-Selective Etching of III-V and Wide Gap Semiconductors," 1st CEPHONA Workshop on Microscopic Characterisation of Materials and Structures for Photonics, Warsaw, Nov. 24, 2003.

A.R. Clawson, "Guide to references on III-V semiconductor chemical etching", Materials Science and Engineering, vol. 31, pp. 1-438, (Jan. 2001).

Computer translation of JP2004153287 (May 2013).

* cited by examiner

US 9,922,830 B2

HYBRID III-V TECHNOLOGY TO SUPPORT MULTIPLE SUPPLY VOLTAGES AND OFF STATE CURRENTS ON SAME CHIP

FIELD OF THE INVENTION

The present invention relates to hybrid III-V semiconductor material technology, and more particularly, to techniques for forming dual III-V semiconductor channel materials to enable fabrication of different device types on the same chip/wafer.

BACKGROUND OF THE INVENTION

In many applications, it is often desirable to be able to fabricate different types of devices on the same wafer. For instance, one might want to produce logic and memory devices on the same chip. Different devices, however, have different requirements. For instance, logic devices might require a different supply voltage than a memory device, and with memory devices, such as static random access memory (SRAM), controlling leakage current is an important consideration. Thus being able to fabricate different types of devices on the same chip presents some unique challenges.

The use of III-V semiconductor materials (i.e., materials that include at least one group III element and at least one group V element) has been proposed for future generations of metal oxide semiconductor field-effect transistor (MOSFET) devices. This is due to their favorable electron transport properties. See, for example, del Alamo et al., "The Prospects for 10 nm III-V CMOS," VLSI Technology Systems and Applications (VLSI-TSA), 2010 International Symposium, pgs. 166-167 (April 2010) (hereinafter "del Alamo"). It is however difficult to implement a III-V semiconductor material in the context of a hybrid device design, i.e., one wherein multiple types of devices are being fabricated on the same chip. Take for instance the example above of a chip having both logic and memory devices. While use of a III-V material as the channel material for a logic device is rather straightforward, in order to meet the low leakage current requirements for the memory devices, the III-V material would have to be much more dense. Thus finding a III-V material to meet the unique specifications of these different device types is a challenge.

Thus, techniques that permit implementation of a III-V semiconductor material in the context of fabricating hybrid device designs on the same chip would be desirable.

SUMMARY OF THE INVENTION

The present invention provides techniques for forming dual III-V semiconductor channel materials to enable fabrication of different device types on the same chip/wafer. In one aspect of the invention, a method of forming dual III-V semiconductor channel materials on a wafer is provided. The method includes the steps of: providing a wafer having a first III-V semiconductor layer on an oxide; forming a second III-V semiconductor layer on top of the first III-V semiconductor layer, wherein the second III-V semiconductor layer comprises a different material with an electron affinity that is less than an electron affinity of the first III-V semiconductor layer; using shallow trench isolation to define at least one first active area and at least one second active area in the wafer; converting the first III-V semiconductor layer in the at least one second active area to an insulator using ion implantation; and removing the second III-V semiconductor layer from the at least one first active area selective to the first III-V semiconductor layer, wherein the first III-V semiconductor layer in the at least one first active area and the second III-V semiconductor layer in the at least one second active area serve as the dual III-V semiconductor channel materials on the wafer.

In another aspect of the invention, a wafer having dual III-V semiconductor channel materials is provided. The wafer includes at least one first active area defined in the wafer, the at least one first active area comprising a first III-V semiconductor layer; and at least one second active area defined in the wafer, the at least one second active area comprising a second III-V semiconductor layer over the first III-V semiconductor layer, wherein the second III-V semiconductor layer comprises a different material with an electron affinity that is less than an electron affinity of the first III-V semiconductor layer, and wherein the first III-V semiconductor layer in the at least one second active area is configured to serve as an insulator, and wherein the first III-V semiconductor layer in the at least one first active area and the second III-V semiconductor layer in the at least one second active area serve as the dual III-V semiconductor channel materials on the wafer.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for implementing III-V semiconductor materials for use in fabricating different types of devices (such as logic and memory devices) on the same chip. Specifically, the present techniques utilize a hybrid, i.e., dual, channel design, wherein a dual III-V material channel is first formed followed by selective removal of one of the materials in one or multiple regions of the chip. That way, the channel material can be selectively tailored to the specific device types being fabricated on the chip. Accordingly, the chip will be able to support the multiple supply voltages, off state currents, etc. of the various devices thereon.

The term III-V semiconductor material (or simply III-V material), as used herein and throughout the following description, refers to a material that includes at least one group III element and at least one group V element. By way of example only, suitable III-V materials include, but are not limited to, one or more of aluminum gallium arsenide (AlGaAs), aluminum gallium nitride (AlGaN), aluminum indium arsenide (AlInAs), aluminum nitride (AlN), gallium antimonide (GaSb), gallium arsenide (GaAs), gallium nitride (GaN), indium antimonide (InSb), indium arsenide (InAs), indium gallium arsenide (InGaAs), indium gallium nitride (InGaN), indium nitride (InN), indium phosphide (InP) and combinations including at least one of the foregoing materials. According to an exemplary embodiment, the III-V material is InGaAs.

Figure 1:
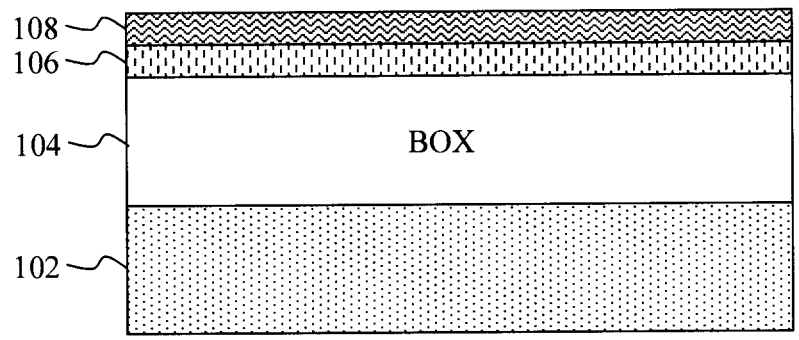
FIG. 1 is a cross-sectional diagram illustrating a starting platform for the fabrication of devices on a chip, including a semiconductor-on-insulator (SOI) wafer and a first III-V material layer having been formed on the SOI wafer according to an embodiment of the present invention.

The present techniques will now be described by way of reference to FIGS. 1-7. To begin, dual III-V semiconductor channel materials will be formed on a wafer. Then, some exemplary devices such as memory and logic field-effect transistors (FETS) will be formed using the dual III-V semiconductor channel materials. As shown in FIG. 1, the starting platform for the fabrication process can be a semiconductor-on-insulator (SOI) wafer. In general, a SOI wafer includes a SOI layer separated from a substrate 102 (e.g., a silicon (Si) substrate) by a buried oxide (or BOX) 104. Suitable oxide materials for the BOX include, but are not limited to silicon dioxide ($SiO_2$). Suitable semiconductor materials for the SOI layer include, but are not limited to, silicon, germanium, and silicon germanium.

Commercially available SOI wafers may, as in the example shown, be modified for specific applications. In this case, a III-V semiconductor-on-insulator (also referred to herein as III-V-on-insulator) wafer is produced. In the example shown, an oxide layer 106 is formed on the BOX 104, and a III-V material layer 108 is formed on the oxide layer 106. Thus, III-V material layer 108 may also be referred to herein as the SOI layer and/or as a III-V-on-insulator layer.

In general, the III-V material layer 108 can include one or more of any of the III-V materials provided above and/or known in the art. However, as will be described in detail below, in the dual channel material design presented herein, a different III-V material with a smaller electron affinity (i.e., a III-V material with an electron affinity that is less an electron affinity of the III-V material layer 108) will be used in conjunction with material 108 to form a dual III-V material channel because the threshold voltage of undoped-body long-channel fully-depleted semiconductor-on-insulator (FDSOI) FETs is given by the difference of metal gate work function and semiconductor electron affinity. Thus, depending on the particular combination of materials chosen for this aspect of the teachings, the III-V material chosen for layer 108 should be a larger electron affinity material (vis-à-vis the second/dual III-V material chosen). A review of the electron affinity of some exemplary III-V materials may be found, for example, in I. Vurgaftman et al., "Band parameters for III-V compound semiconductors and their alloys", Journal of Applied Physics, vol. 89, no. 11, pp. 5815-5875, (June 2001), the contents of which are incorporated by reference as if fully set forth herein. As is known in the art, electron affinity is the energy obtained from moving an electron from the vacuum energy level to the bottom of the conductance band.

According to an exemplary embodiment, oxide layer 106 is formed from aluminum oxide ($Al_2O_3$), and III-V material layer 108 is formed from InGaAs. In addition to the BOX 104, the oxide layer 106 also serves as a buried oxide/insulator. InGaAs-on-insulator wafers with $Al_2O_3$ buried oxide may be formed using direct wafer bonding processes. According to an exemplary embodiment, the III-V-on-insulator direct wafer bonding (DWB) proceeds by: 1. oxidizing a bulk silicon (Si) wafer in a furnace to form a good furnace-oxide silicon dioxide ($SiO_2$) layer on the wafer, and then depositing $Al_2O_3$ onto the $SiO_2$ layer, 2. growing the III-V channel material layer epitaxially on a second (III-V) substrate, and then depositing $Al_2O_3$ onto the III-V channel material layer, 3. performing DWB of the Si wafer and the III-V wafer where the bond is formed between the two $Al_2O_3$ layers on the two wafers (please note that at this stage, the III-V wafer is upside down meaning that the III-V substrate is on top), and 4. removing the III-V substrate (now on top) selective to $Al_2O_3$ via an etching process.

For detailed description of another exemplary III-V-on-insulator DWB process see, for example, Yokoyama et al., "Sub-10-nm Extremely Thin Body InGaAs-on-Insulator MOSFETs on Si Wafers With Ultrathin $Al_2O_3$ Buried Oxide Layers," IEEE Electron Device Letters, vol. 32. issue 9 (September 2011) (hereinafter "Yokoyama"), the contents of which are incorporated by reference as if fully set forth herein. It is notable that the process described in Yokoyama is similar to the III-V-on-insulator DWB process in the exemplary embodiment provided above, but there are some differences. For instance, Yokoyama does not teach oxidizing the Si wafer and directly deposited $Al_2O_3$. Therefore, the wafer in Yokoyama has a single $Al_2O_3$ BOX layer. While either configuration (either the III-V-on-insulator DWB shown in the figures and described above, or that described in Yokoyama) may be used in accordance with the present techniques, a $SiO_2/Al_2O_3$ composite BOX layer, as according to the present techniques, can be advantageous because furnace oxides, in general, are far better in terms of being an insulator (high resistivity) as compared to deposited oxides.

Alternatively, while not shown in the figures, the III-V material layer 108 may be epitaxially grown on the wafer using, for example, molecular beam epitaxy (MBE) or metalorganic chemical vapor deposition (MOCVD). By way of example only, the formation of InGaAs on a germanium-on-insulator wafer using MBE is described in Cooke, "First InGaAs n-MOSFETs on germanium-on-insulator," Semiconductor Today, Compounds & Advanced Silicon, vol. 7, issue 10 (December 2012/January 2013), the contents of which are incorporated by reference as if fully set forth herein. With whatever process that is employed, as shown in FIG. 1, the result will be III-V material layer 108 on an insulator. III-V material layer 108 will be the first of two (dual) III-V channel materials to be formed on the wafer by the present process.

Figure 2:
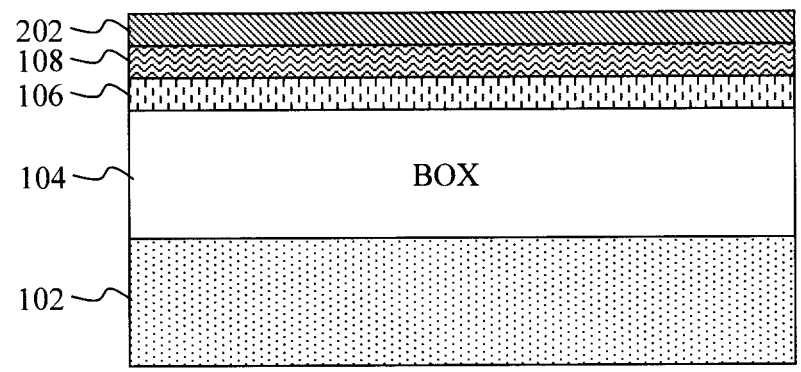
FIG. 2 is a cross-sectional diagram illustrating a second (smaller electron affinity) III-V material layer having been epitaxially grown on the first III-V material layer according to an embodiment of the present invention.

Namely, next as shown in FIG. 2, a (second) III-V material layer 202 is then formed on the (first) III-V material layer 108. As provided above, relative to (first) III-V material layer 108, (second) III-V material layer 202 should be a different smaller electron affinity III-V material (i.e., a III-V material having an electron affinity that is less than the electron affinity of the (first) III-V material layer 108). Thus, in general, the specific choice of III-V materials to form the (first) III-V material layer 108 and (second) III-V material layer 202 should meet the criteria that the III-V material for layer 108 is a larger electron affinity material than the III-V material for layer 202. By way of example only, when the (first) III-V material layer 108 is formed from InGaAs, a suitable choice for the (second) III-V material layer 202 might be InP, as InP has a smaller electron affinity than InGaAs. Accordingly, in the instant example, InGaAs/InP will be used as an exemplary dual III-V channel material. It is to be understood, however, that any combination of relatively larger/smaller electron affinity III-V materials might be employed in accordance with the present techniques.

In addition to the relatively larger/smaller electron affinity requirement detailed above, other criteria that may be taken into consideration when selecting the (first and second) III-V materials include, for example, the ability to epitaxially grow (see below) the (second) III-V material layer 202 on the (first) III-V material layer 108 without creating dislocations. This implies that the (first) III-V material layer 108 and the (second) III-V material layer 202 are preferably lattice matched or, if not latticed matched, the (second) III-V material layer 202 should be a thin layer so that it does not relax when formed on the (first) III-V material layer 108. By way of example only, some additional examples of suitable combinations of a (first) III-V material layer 108 and (second) III-V material layer 202 include, but are not limited to, (a) (first) III-V material layer 108 is InGaAs and (second) III-V material layer 202 is a thin layer of GaAs or AlGaAs, (b) (first) III-V material layer 108 is GaAs and (second) III-V material layer 202 is AlGaAs, (c) (first) III-V material layer 108 is InP and (second) III-V material layer 202 is a thin layer of GaAs or AlGaAs, and (d) (first) III-V material layer 108 is InSb and (second) III-V material layer 202 is a thin layer of InAs or InGaAs.

It is generally assumed herein that one skilled in the art, given the present teachings, would know which material combinations are lattice matched and which are not. The following (non-limiting) examples are given to further illustrate this concept. InGaAs with 53% In is lattice matched to InP. However, InGaAs (with any In %) is not lattice matched to GaAs or AlGaAs. Therefore, the second deposited III-V layer should be a thin layer so that it does not relax when formed on the first deposited III-V layer (see below). Thus, if InGaAs is used in combination with GaAs, then the GaAs should be deposited as a thin layer on the InGaAs. GaAs is lattice matched to AlGaAs. However, InP is not lattice matched to GaAs or AlGaAs, and InSb is not lattice matched to InAs or InGaAs. Thus again, with the combinations of InP/GaAs or InP/AlGaAs and InSb/InAs or InSb/InGaAs, the second deposited III-V layer should be thin enough that it does not relax when formed on the first deposited layer. When the combination includes lattice matched materials, the thickness of the layers is not a consideration in terms of the second layer 'relaxing' when deposited on the first layer, however channel thickness (for both first/second III-V layers) may be a consideration for short-channel electrostatic reasons—see below.

As described immediately above, non-lattice matched combinations of (first and second) III-V materials may be used as long as the second III-V material deposited on the first III-V material is not formed as a thick enough layer to cause the second III-V material to relax. To prevent 'relaxing' of the second III-V material, the (second) material is formed as a thin layer, the maximum thickness of which (i.e., to prevent relaxing of the layer) depends on the lattice mismatch between the (relaxed) first and second III-V materials. More specifically, one can grow a thin layer of (e.g., a second III-V) material on a thick layer of (e.g., a first III-V) material (that sets the lattice constant) and have the second III-V thin-layer material conform to the lattice constant of the first III-V thick-layer material. In that case, the second III-V material will be under strain (i.e., tensile strain if relaxed second III-V material has a lattice constant that is smaller than the lattice constant of the first III-V material, or compressive if relaxed second III-V material has a lattice constant that is larger than the lattice constant of the first III-V material). The amount of the second III-V thin-layer material that one can grow depends on the lattice mismatch between the relaxed second III-V material and the relaxed first III-V material. The Matthews-Blakeslee model is a well-accepted model for this for equilibrium growth, that is, when growth temperature is ramped down slowly after growth is completed. Hence, "equilibrium" growth. The Matthews-Blakeslee model is described, for example, in J. W. Matthews and A. E. Blakeslee, "Defects in Epitaxial Multilayers, I. Misfit Dislocations" Journal of Crystal Growth 27 (December 1974) pgs. 118-125, the contents of which are incorporated by reference as if fully set forth herein. By way of example only, based on this "equilibrium" Matthews-Blakeslee model, the (second III-V material) layers in the lattice-mismatched examples given immediately above would need to have a thickness of less than about 10 nm, e.g., a thickness of from about 2 nm to about 10 nm.

The use of a thinner lattice-mismatched material in accordance with the present techniques is thus an option. Namely, for planar single-gate FDSOI devices, for short-channel devices, one needs thin layers for short-channel electrostatic reasons. As a general rule, it is desirable to have a channel thickness $T_{ch} < L_{eff}/5$, where $L_{eff}$ is the effective channel length of the FET. This rule applies to extremely-thin SOI (ETSOI) devices. See, for example, Majumdar et al., "Gate Length and Performance Scaling of Undoped-Body Extremely Thin SOI MOSFETs," IEEE Electron Device Letters, vol. 30, No. 4 (April 2009), the contents of which are incorporated by reference as if fully set forth herein. Take for example a FET preferably having a $L_{eff} < 20$ nm, which means that $T_{ch}$ has to be $\leq 20/5 = 4$ nm. This value of $T_{ch}$ is within the Matthews-Blakeslee model limit as provided above. With these short-channel electrostatic factors in mind, according to an exemplary embodiment, both of the (first and second) III-V material layers are thin, for example, the first and second III-V material layers each have a thickness of less than about 10 nm, e.g., each layer has a thickness of from about 2 nm to about 10 nm.

Further, it is preferable that the dual III-V channel material configuration shown be implemented wherein the (relatively) smaller electron affinity III-V material is present on top of the larger electron affinity III-V material. Namely, as will be described in detail below, the top layer is selectively removed from one or more regions of the wafer. It is preferable that the layer removed in these regions is the smaller electron affinity material.

According to an exemplary embodiment, the (second) III-V material layer 202 is epitaxially grown on the (first) III-V material layer 108. As provided above, suitable epitaxy techniques for growing III-V materials include, but are not limited to, MBE and MOCVD.

Figure 3:
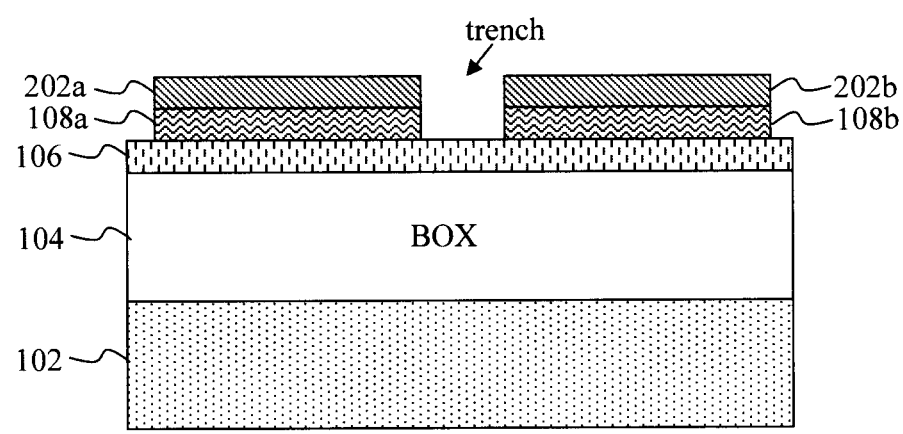
FIG. 3 is a cross-sectional diagram illustrating trenches having been patterned in the first III-V material layer and the second III-V material layer according to an embodiment of the present invention.

The (first) III-V material layer 108 and/or the (second) III-V material layer 202 will be used as the channel material for multiple devices on the wafer. Shallow trench isolation (STI) will be used to define different and distinct active areas in the wafer. In general, STI involves patterning trenches in a material(s) and then filling the trenches with a dielectric material, such as an oxide material. Thus, as shown in FIG. 3, in order to define different and distinct active areas in the wafer, the III-V material layer 108 and the III-V material layer 202 are patterned, forming trenches therein. For clarity of description, the segments of the III-V material layer 108 and the III-V material layer 202 resulting from this patterning step are given the reference numerals 108a, 108b, etc. and 202a, 202b, etc., respectively.

Figure 4:
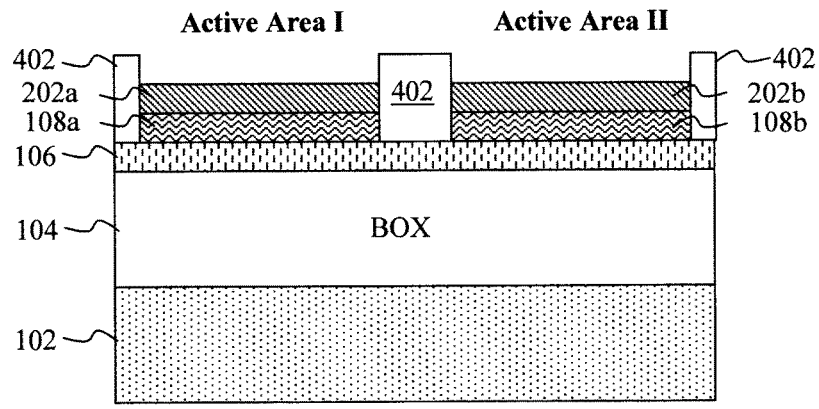
FIG. 4 is a cross-sectional diagram illustrating the trenches having been filled with an insulator material, forming shallow trench isolation (STI) regions that define different, distinct active regions of the wafer according to an embodiment of the present invention.

Then, as shown in FIG. 4, the trenches are filled with a dielectric material to form STI regions 402. Suitable STI dielectric materials include, but are not limited to, silicon dioxide ($SiO_2$). As a result, distinct active areas of the wafer are now formed, e.g., one including segments 108a and 202a of the (first) III-V material layer 108 and the (second) III-V material layer 202, respectively; another including segments 108b and 202b of the (first) III-V material layer 108 and the (second) III-V material layer 202, respectively; etc. For ease and clarity of description, one of the now-formed active areas is arbitrarily labeled "Active Area I" and the other is labeled "Active Area II." Of course, more than two active areas may be formed during the present process. Thus, reference may be made herein to one or more (first) Active Areas I, one or more (second) Active Areas II, etc.

Next, the (first) III-V material layer 108 in one or more of the active areas is selectively converted to an insulator using ion implantation. For ease and clarity of description, the figures depict this ion implantation process being performed on segment 108b of the (first) III-V material layer 108 in Active Area II. This is only an example, and any (one or more) of the active areas now defined in wafer may be processed in the same manner being described herein.

Figure 5:
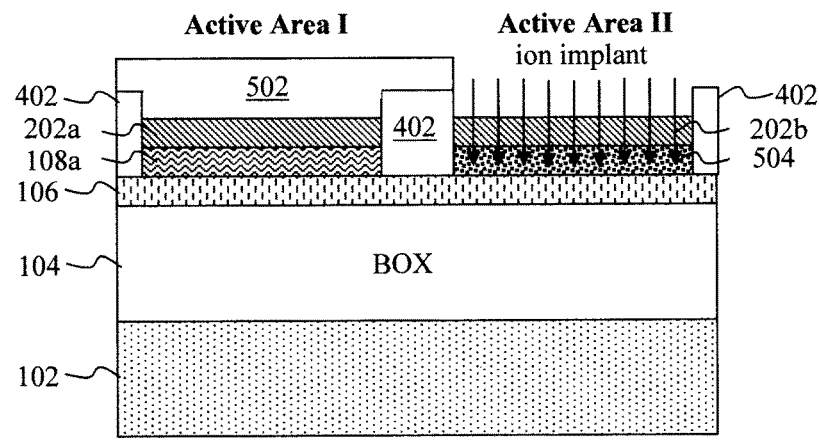
FIG. 5 is a cross-sectional diagram illustrating a photoresist mask having been formed to block/mask one or more of the active areas of the wafer, leaving one or more other of the active areas unmasked, and an ion implant being performed to convert the first III-V material layer in the unmasked active areas to an insulator, and after which the photoresist mask is removed according to an embodiment of the present invention.

It is first necessary to mask or block off those active areas in which ion implantation will not occur. Basically, as will become apparent in the description that follows, ion-implantation is not desired in those active areas from which the (second) III-V material layer 202 will be removed and where the (first) III-V material layer 108 will serve as the channel material. As shown in FIG. 5 a photoresist mask 502 is formed on the wafer blocking/masking the active area(s) of the wafer that will not receive an ion implant (in this example, Active Area I). The result is one or more masked active areas and one or more unmasked active areas of the wafer.

Next, as shown in FIG. 5, ion implantation is performed into the unmasked active areas. As provided above, the goal is to convert (via the ion implant) the segment(s) of the (first) III-V material layer 108 in the given unmasked active area(s) into an insulator. In general, ion implantation involves introduction of ions into a material so as to change the physical, chemical, and electrical properties of the target material. In this case, the goal is to create physical defects in the select segments of the (first) III-V material layer 108 so as to convert the (first) III-V material layer 108 in those unmasked active areas to an insulator. Specifically, the physical defects create defect states within the band gap of the semiconductor. Defect states that reside in near the middle of the band gap, referred to as mid-gap states, are very efficient electron and hole traps, thus converting the semiconductor into an insulator. Suitable ions include, but are not limited to, oxygen ($O_2$), iron (Fe), and/or chromium (Cr). When ion implantation is used as a doping mechanism, it is often accompanied by an activation anneal. However, since the goal here is to create defects in the material, an activation anneal is not needed. Regardless, if an anneal was to be performed, it would not make the treated segments of the (first) III-V material layer 108 (segments 108b, see below) conducting because once these segments 108b are amorphized, the material will not re-crystallize from either the top (because the overlying III-V material layer 202b is preferably a thin layer (see description above about preferably employing a thin channel layer short-channel electrostatic reasons) and not re-crystallize) or from the bottom because layer 106 is an amorphous oxide layer.

As is apparent from the above-described process, the (first) III-V material layer 108 was deposited onto the wafer before the (second) III-V material layer 202, thus the (first) III-V material layer 108 (into which the implant is now being performed) underlies the (second) III-V material layer 202 in these unmasked active areas. The ion energy determines the depth at which the ions are implanted into a target substrate, as does the material composition of the target. In this case, ion implantation is desired into the underlying (first) III-V material layer 108. One skilled in the art is capable of configuring an ion implantation system to achieve this desired implantation depth for a given set of (i.e., III-V) materials. Following the ion implantation, the treated segments of the (first) III-V material layer 108 (i.e., segments 108b in this particular example) are converted to an insulator 504, and hence from this point on given a different hashing pattern in the figures. Following ion implantation, the photoresist mask 502 may then be removed, e.g., using a wet etching process.

Figure 6:
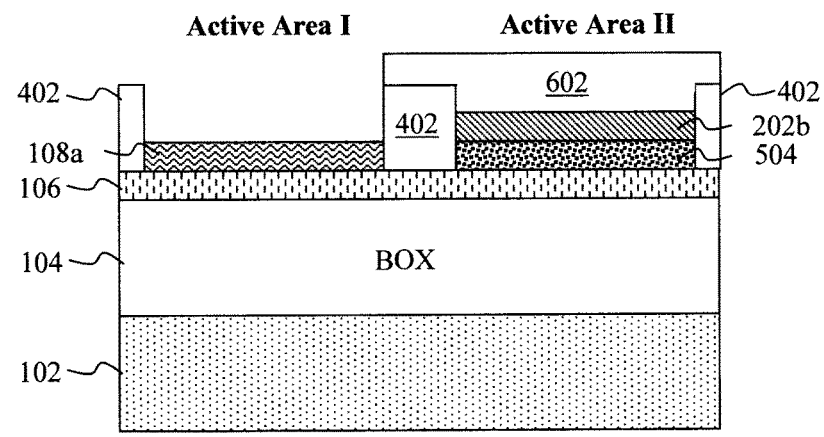
FIG. 6 is a cross-sectional diagram illustrating a photoresist mask having been formed to block/mask one or more of the active areas of the wafer which did not receive an ion implant, leaving one or more other of the active areas unmasked, and the second III-V material having been removed from the unmasked active areas, and after which the photoresist is removed according to an embodiment of the present invention.

The masking process is then repeated to mask off the active area(s) that received the ion implant. In general, the segments of the (second) III-V material layer 202 will be selectively removed from those regions that did not receive an ion implant (e.g., in this example Active Area(s) I). In order to do so, as shown in FIG. 6, a photoresist mask is formed on the wafer blocking/masking the active area(s) of the wafer from which the (second) III-V material layer 202 will not be removed (i.e., the material layer 202 will remain in those active areas). Again, the result is one or more masked active areas and one or more unmasked active areas of the wafer. According to an exemplary embodiment, the photoresist mask 602 is formed from the same material as photoresist mask 502 above.

With the photoresist mask 602 in place blocking/masking the active areas in which the (second) material layer 202 is to remain, an etch can then be used to remove the segments of the (second) III-V material layer 202 selective to the underlying (first) III-V material layer 108. Again, the Active Area(s) I are arbitrarily chosen as the active area(s) from which the segment(s) 202a of the second III-V material layer 202 is removed. What is notable is that this removal (of the (second) material layer 202) does not occur in the active area(s) in which an ion implant (see FIG. 5) was conducted into the (first) III-V material layer 202, and vice-a-versa. Thus, in other words, the ion implant (into the segments of the (first) III-V material layer 108) is conducted in one or more (first) active areas, and the segments of the (second) III-V material layer 202 are removed from one or more (second) other active areas. As a result of this process, the (first) III-V material layer 108 will serve as the channel material for one or more of the active areas (e.g., Active Area(s) I) and the (second) III-V material layer 202 will serve as the channel material for one or more of the active areas (e.g., Active Area(s) II).

Techniques for selectively etching a III-V semiconductor material relative to another III-V semiconductor, or other material would be within the capabilities of one of ordinary skill in the art. See, for example, Weyher, "Defect-Selective Etching of III-V and Wide Gap Semiconductors," $1^{st}$ CEPHONA Workshop on Microscopic Characterisation of Materials and Structures for Photonics, Warsaw, Nov. 24, 2003, and A. R. Clawson, "Guide to references on III-V semiconductor chemical etching", Materials Science and Engineering, vol. 31, pp. 1-438, (January 2001), the contents of each of which are incorporated by reference as if fully set forth herein. As shown in FIG. 6, removal of the (second) material layer 202 from the unmasked active area(s) results in the (first) III-V material layer 108 being the only III-V channel material in those (unmasked) active areas. As described above, the (first) III-V material layer 108 is converted to an insulator in the other (currently masked) active areas, and thus the (second) III-V material layer 202 will serve as the channel material in those active areas. Having one material serve as the channel material in one or more active areas and another different III-V material serve as the channel material in one or more other active areas is what is being referred to herein as dual channel materials.

Following the selective removal of the (second) III-V material layer 202 from the unmasked active areas, the photoresist mask 602 may then be removed, and one or more devices can be fabricated in the active areas. See FIG. 7. In the example shown in FIG. 7, one device 702 is fabricated in Active Area(s) I and one device 704 is fabricated in Active Area(s) II. This is, however, merely an example meant to illustrate the present techniques. The devices (702, 704, etc.) shown are transistors. In general, a transistor includes a source (702s, 704s, etc.) and a drain (702d, 704d, etc.) interconnected with one another by a channel, and a gate electrode (702g, 704g, etc.) that regulates electron flow through the channel. In the present embodiments, the channel is formed from the respective III-V material. The gate is often separated from the channel by a dielectric material (i.e., a gate dielectric). By way of example only, at least one of the devices formed is a memory device and at least one is a logic device. Logic devices are high performance FETs with low threshold voltage while memory/SRAM devices are low leakage current FETs with high threshold voltage. As provided above, these different types of devices have different characteristics and requirements. Advantageously, by way of the present techniques, different (III-V) channel materials may be produced/employed for each type of device so as to meet the specific requirements of the different devices on the same wafer.

The gate dielectric along with the gate electrode material(s) are also referred to herein as a gate stack. Thus, to form the gate stack, a layer of the gate dielectric is first formed on the respective III-V channel material. Suitable gate dielectric materials include oxides (e.g., silicon dioxide) which can be deposited or grown on the wafer using a thermal oxidation process. When a metal gate electrode is used, it may be preferable to employ a high-k dielectric, such as aluminum oxide, hafnium oxide or lanthanum oxide, which can be deposited onto the wafer. Next, one or more layers of a gate electrode material or materials is/are deposited onto the gate dielectric. Suitable gate materials include, but are not limited to, a metal(s) and doped polysilicon. The composition of the gate stacks (including the gate dielectric and/or the gate electrode 702g, 704g, etc.) can be varied for one or more of the devices being formed on the wafer, if so desired. For example, one or more of the devices may be fabricated with metal gates, while one or more others have doped polysilicon gates. Alternatively, all of the devices may use the same gate configuration. In that instance, the gate stack materials can be blanket deposited onto the wafer and then patterned into individual gate stacks.

Figure 7:
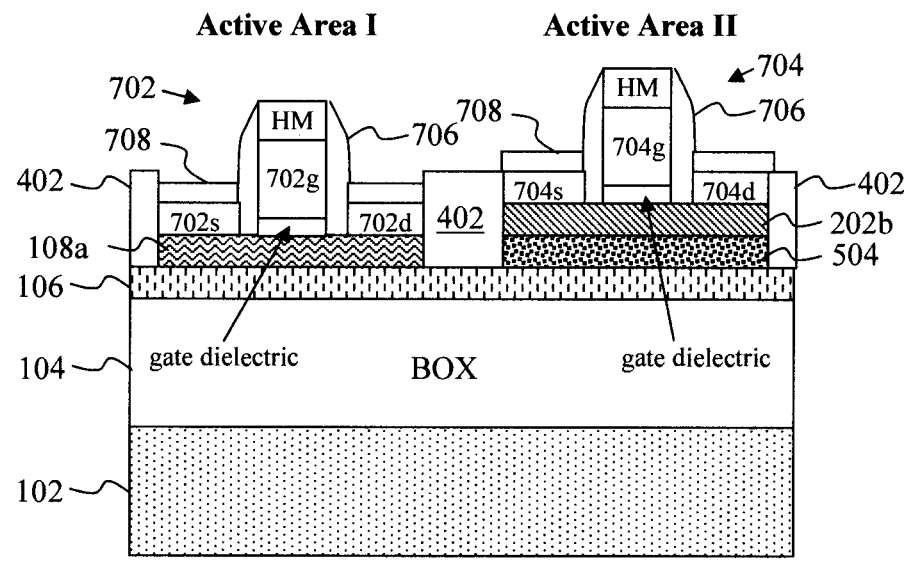
FIG. 7 is a cross-sectional diagram illustrating transistor devices having been formed in one or more of the active areas according to an embodiment of the present invention.

A standard lithography and etching process can be used to pattern the gate stack from the gate dielectric and electrode layers. Basically, a hardmask (see HM in FIG. 7) is patterned on the stack of layers with the footprint and location of the individual gate stacks. The individual gates can then be patterned using an etch such as reactive ion etching (RIE). As shown in FIG. 7, the gate hardmask can be left in place (if so desired) to protect the gates during subsequent processing steps.

Spacers 706 are formed on opposite sides of each of the gate stacks. See FIG. 7. Spacers offset the gate stacks from the source and drain regions of the device. Suitable spacer materials include, but are not limited to, nitride materials such as silicon nitride. The spacers 706 may be formed by first depositing the spacer material onto the wafer, and then patterning the material to form the spacers.

A standard in-situ-doped epitaxy process may then be used to thicken the source (702s, 704s, etc.) and drain (702d, 704d, etc.) regions. Source and drain regions prepared in this manner may also be referred to herein as raised source and drains (or RSD). FIG. 7 depicts the source (702s, 704s, etc.) and drain (702d, 704d, etc.) regions as RSDs.

Optionally, contacts 708 can be formed to the source and drain regions. By way of example only, contacts 708 can be formed by first depositing a metal(s) onto the wafer (i.e., onto the RSD regions). An anneal process is then used to react the metal with the RSD to form a metal-III-V alloy. Any unreacted metal can be removed using, for example, a wet etching process that is selective to the STI oxide, the spacer nitride, and the reacted metal-III-V alloy. Thus, the contact formation is a self-aligning process (also referred to herein as a salicide) in the sense that the contacts form only where the deposited metal is in contact with the RSD semiconductor. It is notable that even though the terms silicide and silicidation refer to a metal-silicon reaction, as is common in the art these terms are being used herein to generally refer to any metal-semiconductor interaction (not just silicon). Further, since the gate hardmask remains in place during the contact formation, no silicide is formed on top of the gates. However, it may be desired to also form a gate contact during the same process (and in the same manner as described) for the source and drain contacts.

As described above, and as shown illustrated in FIG. 7, the device(s) formed in Active Area I will have a different III-V channel material from the device(s) formed in Active Area II. In the particular configuration shown, Active Area I will include a (relatively) larger electron affinity III-V material and Active Area II will include a (relatively) smaller electron affinity material.

Figure 8:
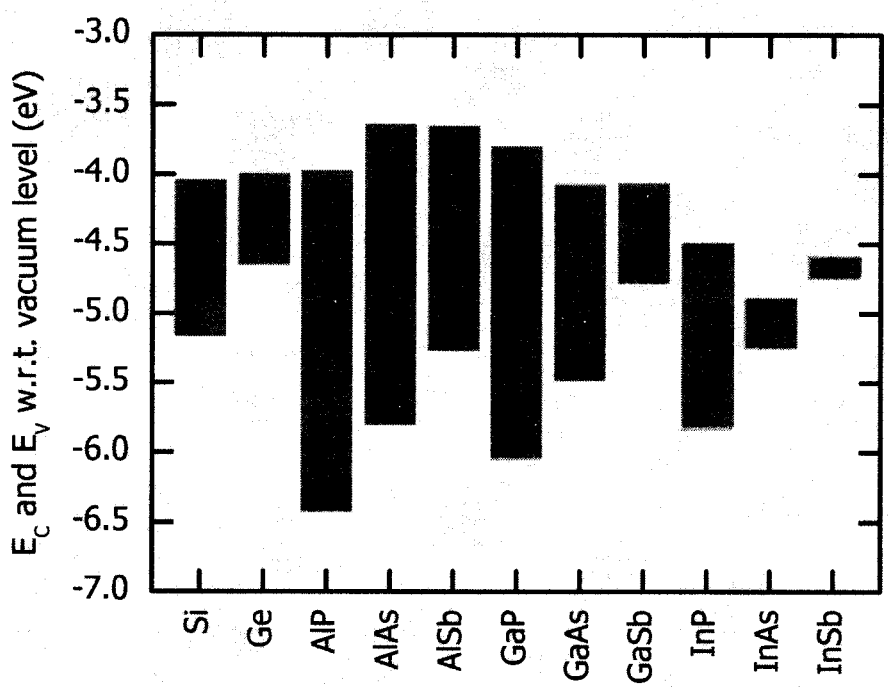
FIG. 8 is a diagram showing electron affinity and band gap for some exemplary III-V materials that may be used in accordance with the present techniques according to an embodiment of the present invention.
Figure 9A:
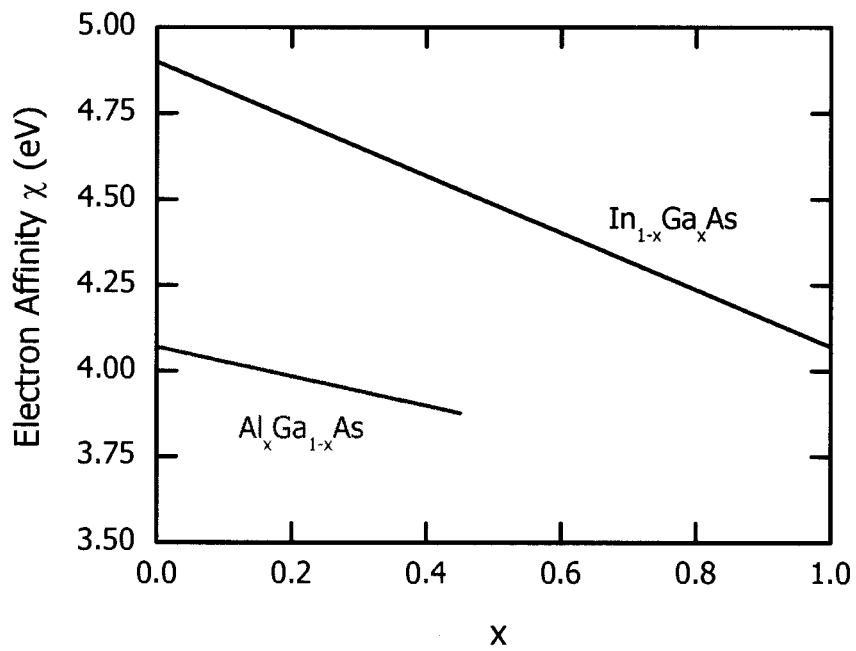
FIG. 9A is a diagram showing electron affinity for two exemplary III-V materials, $Al_xGa_{1-x}As$ and $In_{1-x}Ga_xAs$, that may be used according to an embodiment of the present invention.
Figure 9B:
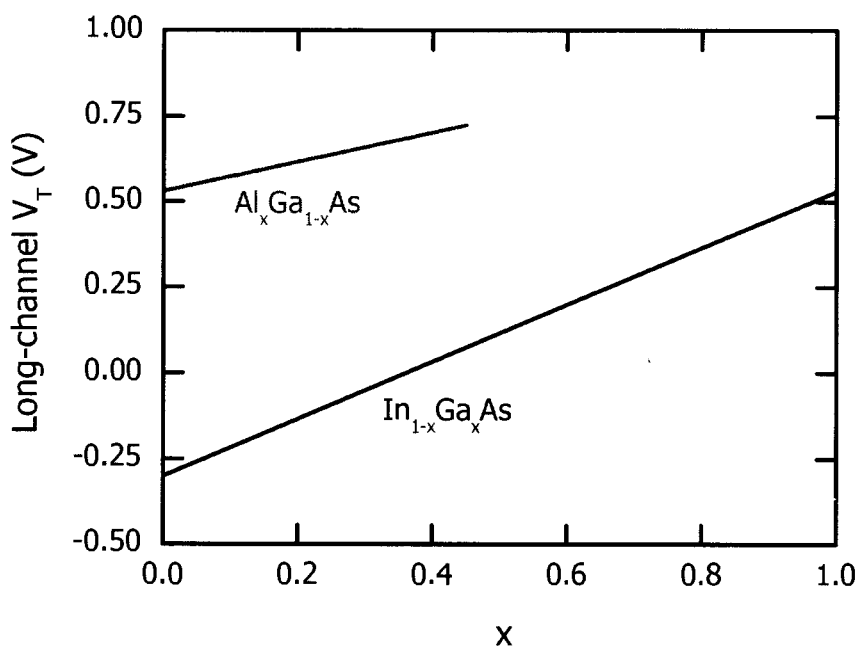
FIG. 9B is a diagram showing long channel threshold voltage $V_T$ for two exemplary III-V materials, $Al_xGa_{1-x}As$ and $In_{1-x}Ga_xAs$, that may be used according to an embodiment of the present invention.

The dual channel materials achieved using the present techniques can allow for a wide range of threshold voltage $V_T$ values. See, for example, FIG. 8 which is a diagram illustrating electron affinity and band gap for some exemplary III-V materials that may be used in accordance with the present techniques. Silicon (Si) and germanium (Ge) are included for reference. As shown in FIG. 8, with these III-V materials there is a wide spread in electron affinity $\chi$ and energy band gap $E_G$ that enables tuning of the transistor threshold voltage $V_T$ over a wide range. The $V_T$ of undoped-body long-channel fully-depleted silicon on insulator (FD-SOI) field effect transistor (FET) devices is:

$$V_T = \phi_M - \chi,$$

wherein $\phi_M$ is metal work function. Thus, for instance, for a standard gate metal, such as titanium nitride (TiN), with $\phi_M = 4.6$ electron volts (eV), the long-channel $V_T$ can be tuned from −0.3 V (depletion mode FETs) to 0.7V (enhancement mode FETs) for many III-V materials of interest. See FIGS. 9A-B. For simplicity, data is shown for x<0.45 for $Al_xGa_{1-x}As$ when it is a direct band gap material.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A wafer having dual III-V semiconductor channel materials, the wafer comprising:
   at least one first active area defined in the wafer, the at least one first active area comprising a first III-V semiconductor layer disposed directly on an oxide layer; and
   at least one second active area defined in the wafer, the at least one second active area comprising i) a portion of the first III-V semiconductor layer having one or more implanted ions selected from the group consisting of: oxygen, iron and chromium, and by way of the implanted ions the portion of the first III-V semiconductor layer present in the at least one second active area is configured to serve as an insulator and ii) a second III-V semiconductor layer disposed directly on the insulator, wherein the second III-V semiconductor layer comprises a different material with an electron affinity that is less than an electron affinity of the first III-V semiconductor layer, wherein the second III-V semiconductor layer is absent in the at least one first active area, and wherein the first III-V semiconductor layer in the at least one first active area and the second III-V semiconductor layer in the at least one second active area serve as the dual III-V semiconductor channel materials on the wafer.

2. The wafer of claim 1, wherein the at least one first active area and the at least one second active area are defined in the wafer using shallow trench isolation.

3. The wafer of claim 1, wherein the first III-V semiconductor layer comprises a material selected from the group consisting of: aluminum gallium arsenide, aluminum gallium nitride, aluminum indium arsenide, aluminum nitride, gallium antimonide, gallium arsenide, gallium nitride, indium antimonide, indium arsenide, indium gallium arsenide, indium gallium nitride, indium nitride, indium phosphide and combinations comprising at least one of the foregoing materials.

4. The wafer of claim 1, wherein the second III-V semiconductor layer comprises a material selected from the group consisting of: aluminum gallium arsenide, aluminum gallium nitride, aluminum indium arsenide, aluminum nitride, gallium antimonide, gallium arsenide, gallium nitride, indium antimonide, indium arsenide, indium gallium arsenide, indium gallium nitride, indium nitride, indium phosphide and combinations comprising at least one of the foregoing materials.

5. The wafer of claim 1, further comprising:
   i) at least one first device on the wafer in the at least one first active area and ii) at least one second device on the wafer in the at least one second active area.

6. The wafer of claim 5, wherein the at least one first device is a transistor having the first III-V semiconductor layer as a semiconductor channel material and the at least one second device is another transistor having the second III-V semiconductor layer as a semiconductor channel material.

7. The wafer of claim 1, wherein the first III-V semiconductor layer is an only III-V semiconductor channel material in the at least one first active area.

8. The wafer of claim 1, wherein the second III-V semiconductor layer is an only III-V semiconductor channel material in the at least one second active area.

* * * * *